United States Patent [19]

Smith et al.

[11] Patent Number: 4,894,257

[45] Date of Patent: Jan. 16, 1990

[54] METHOD OF OVERCOATING A HIGH CURRENT DENSITY CATHODE WITH RHODIUM

[75] Inventors: Bernard Smith, Ocean Township, Monmouth County; Gerard L. Freeman, Freehold Township, Monmouth County; Louis E. Branovich, Howell Township Monmouth County, all of N.J.

[73] Assignee: The United States of America as represented by the Secretary of America, Washington, D.C.

[21] Appl. No.: 215,081

[22] Filed: Jul. 5, 1988

[51] Int. Cl.$^4$ ............................ B05D 5/12; H01J 1/15; H01J 9/04
[52] U.S. Cl. .......................................... 427/78; 427/77; 445/46; 445/50; 445/51; 445/58; 313/346 R; 313/630; 313/632
[58] Field of Search ..................... 427/78, 77; 445/46, 445/50, 51, 58; 313/346 R, 630, 632

[56] References Cited

U.S. PATENT DOCUMENTS 3,373,307  3/1968  Zalm et al. ...................... 313/346 R
4,783,613  11/1988  Yamamoto et al. ............. 313/346 R

FOREIGN PATENT DOCUMENTS 60-68527  8/1985  Japan .

Primary Examiner—Norman Morgenstern
Assistant Examiner—Roy V. King
Attorney, Agent, or Firm—Michael Zelenka; Roy E. Gordon

[57] ABSTRACT

A tungsten-iridium billet is impregnated with a chemical mixture of barium oxide, strontium oxide, and aluminum oxide, the impregnated billet heated, and the surface of the impregnated billet desired for emission exposed to an overcoating of rhodium.

8 Claims, No Drawings

METHOD OF OVERCOATING A HIGH CURRENT DENSITY CATHODE WITH RHODIUM

The invention described herein may be manufactured, used, and licensed by or for the government for governmental purposes without the payment to us of any royalty thereon.

This invention relates in general to a method of making a high current density cathode and in particular to a method of making a high current density cathode overcoated with either iridium, rhodium, osmium, or ruthenium from a tungsten-iridiate billet using chemical vapor deposition techniques.

BACKGROUND OF THE INVENTION

In U.S. Pat. No. 4,708,681 issued Nov. 24, 1987 to L. E. Branovich, G. L. Freeman, and B. Smith, for "Method of Making A Long Lived High Current Density Cathode from Tungsten and Iridium Powders," and assigned to a common assignee, a long lived high current density cathode is made from a mixture of tungsten and iridium powders by processing the mixture of powders with an activator into a porous billet, and then impregnating the billet with a chemical mixture of barium oxide, strontium oxide, and aluminum oxide by firing the billet in a dry hydrogen furnace at a temperature at which the impregnant melts.

Though the cathode made by the method of U.S. Pat. No. 4,708,681 gives desirable current densities, it would be desirable to provide a cathod with even better emission characteristics.

SUMMARY OF THE INVENTION

The general object of this invention is to provide a method of making a high current density cathode for millimeter and microwave applications. A more particular object of the invention is to provide a method of making a high current density cathode that will have better emission characteristics than the cathode made by the method of U.S. Pat. No. 4,708,681.

It has now been found that the aforementioned objects can be attained by impregnating a tungsten-iridium billet with a chemical mixture of barium oxide, strontium oxide, and aluminum oxide as in U.S. Pat. No. 4,708,681, heating the impregnated billet and then exposing the surface of the impregnated billet desired for emission to either an iridium, rhodium, osmium or ruthenium containing compound causing iridium, rhodium, osmium or ruthenium to deposit on the hot impregnated billet and provide an overcoating of about 5000 to 6000 angstroms in thickness. The overcoating is formed rapidly using this chemical vapor deposition technique wherein the surface of the impregnated billet desired for emission acts as the substrate. The processing is rapid and better surface coatings are obtained.

DESCRIPTION OF THE PREFERRED EMBODIMENT

A 90 weight percent tungsten to 10 weight percent iridium billet is first formed as for example as taught in U.S. Pat. No. 4,708,681. More particularly, the method involves mixing tungsten and iridium powder in a weight ratio of 89 weight percent tungsten to 10 weight percent iridium. 1 weight percent of zirconium hydride is added to the mixture and the mixture ball milled for about 8 hours. The ball milled mixture is pressed into a billet at about 48,000 p.s.i. in a die. The billet is sintered at 1800° C. for thirty minutes in dry hydrogen of less than than $-100$ dewpoint and the billet then backfilled with copper in dry hydrogen of less $-100$ dewpoint. The billet is then backfilled with copper in dry hydrogen at 1150° C., the billet machined to the desired geometry, and the copper removed by etching in nitric acid. The billet is then thoroughly rinsed in deionized water, methanol, and then dried. The billet is then fired in dry hydrogen at about 1400° C. for about 15 minutes.

The billet is then impregnated with a chemical mixture of barium oxide, strontium oxide, and aluminum oxide, by firing the billet in a dry hydrogen furnace at a temperature at which the impregnant melts or about 1600° C. for about 2 minutes. The billet is removed from the furnace after the furnace is cooled, and loose particles of impregnant are removed from the billet using a jewelers' lathe and fine alumina cloth.

According to the invention, the resulting cathode is then placed in a vacuum system with a feedpipe of either an iridium, rhodium, osmium, or ruthenium containing compound slightly above the impregnated billet or cathode. The cathode is mounted in a jig so that the only surface of cathode exposed to the desired iridium, rhodium, osmium or ruthenium containing compound is the face of the cathode that is desired for emission. The jig must be made of a material such as tantalum or molybdenum.

After a good vacuum has been achieved, heat is applied to an iridium containing compound such as acetylacetonatodicarbonyliridium (I) or to a rhodium containing compound such as hexadecacarbonylhexarhodium (O) or to an osmium containing compound such as dodecacarbonyltriosmium (O) or to a ruthenium containing compound such as dodecacarbonyltriruthenium (O) that is in a reservoir attached to the feedpipe. As the pressure is increased, the rhodium or iridium, or osmium or ruthenium compound begins to vaporize.

The impregnated tungsten-iridium billet is heated to about 450° C. just prior to introducing the rhodium, iridium, osmium, or ruthenium compound over the impregnated billet. As the gaseous rhodium, iridium, osmium, or ruthenium compound hits the tungsten-iridium impregnated billet, chemical decomposition takes place depositing a metal overcoat of about 5000 to 6000 angstroms in thickness on the hot tungsten iridium billet while the rest of the compound that has separated from the metal is gaseous and is pumped from the vacuum system.

The overcoated cathode thus prepared is inexpensive, easier to make, and earier to machine. Moreover, the overcoating is of high purity which enhances the emission performance.

In the foregoing embodiment, other ratios of tungsten and iridium can be used in forming the billet. The 89 weight percent tungsten to 10 weight percent iridium to 1 weight percent activator ratio is especially desirable because it is relatively inexpensive. The molar concentration of $BaO/CaO/Al_2O_3$ that can be used for impregnation of the billet are known molar concentrations such as $5BaO/2CaO/Al_2O_3$ or $4Bao/CaO/Al_2O_3$.

We wish it to be understood that we do not desire to be limited to the exact details of construction as described for obvious modifications will occur to a person skilled in the art.

What is claimed is:

1. A method of making a high current density cathode overcoated with rhodium from a tungsten-iridium billet using chemical vapor deposition techniques, said method including the steps of:

(A) impregnating the billet with a chemical mixture of barium oxide, strontium oxide, and aluminum oxide, by firing the billet in a dry hydrogen furnace at a temperature at which the impregnant melts for about two minutes, (B) placing the impregnated billet in a vacuum system with feedpipe for the introduction of a precursor of rhodium slightly above the impregnated billet, the impregnated billet also being so positioned that the only surface of the impregnated billet to be exposed to the desired precursor of rhodium is the face of the impregnated billet that is desired for emission, and (C) heating the impregnated billet to about 450° C. and then introducing preheated hexadecacarbonylhexarhodium (O), slightly above the impregnated billet causing rhodium to deposit on the hot impregnated billet.

2. Method according to claim 1 wherein the tungsten-iridium billet is about 90 weight percent tungsten to about 10 weight percent iridium.

3. Method according to claim 2 wherein the impregnant is $5BaO/2CaO/Al_2O_3$.

4. Method according to claim 2 wherein the impregnant is $4BaO/CaO/Al_2O_3$.

5. Method according to claim 2 wherein the billet is impregnated at about 1600° C.

6. Method according to claim 2 wherein overcoating metal is introduced slightly above the impregnated billet by heating a rhodium containing compound, hexadecarboxylhexarhodium, contained in a reservoir attached to the feedpipe.

7. Method according to claim 1 wherein the rhodium coating layer is about 5 to 6 thousand angstroms in thickness.

8. A method of making a high current density cathode overcoated with a layer of 5 to 6 thousand angstroms in thickness of rhodium from a 90 weight percent tungsten to 10 weight percent iridium billet using chemical vapor deposition techniques, said method including the steps of:

(A) impregnating the billet with a chemical mixture of $5BaO/2CaO/Al_2O_3$ by firing the billet in a dry hydrogen furnace at about 1600° C. for about two minutes, (B) placing the impregnated billet in a vacuum system with a feedpipe for the introduction of a precursor of rhodium slightly above the impregnated billet, the impregnated billet also being so positioned that the only surface of the impregnated billet to be exposed to the desired precursor of rhodium is the face of the impregnated billet that is desired for emission, and (C) heating the impregnated billet to about 450° C. and then introducing preheated heradecacarbonyllexarhodium slightly above the impregnated billet causing rhodium to deposit on the hot impregnated billet.

* * * * *